(12) United States Patent
Chen

(10) Patent No.: US 11,120,189 B2
(45) Date of Patent: Sep. 14, 2021

(54) SINGLE-ENDED-MODE TO MIXED-MODE TRANSFORMER SPICE CIRCUIT MODEL FOR HIGH-SPEED SYSTEM SIGNAL INTEGRITY SIMULATIONS

(71) Applicant: International Business Machines Corporation, Armonk, NY (US)

(72) Inventor: Zhaoqing Chen, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/946,805

(22) Filed: Apr. 6, 2018

(65) Prior Publication Data

US 2018/0225401 A1    Aug. 9, 2018

Related U.S. Application Data

(62) Division of application No. 15/047,002, filed on Feb. 18, 2016, now Pat. No. 9,984,188.

(51) Int. Cl.
*G06F 30/30*    (2020.01)
*G06F 30/367*    (2020.01)
(Continued)

(52) U.S. Cl.
CPC ............ *G06F 30/367* (2020.01); *G06F 30/30* (2020.01); *G06F 30/39* (2020.01); *G06F 30/394* (2020.01)

(58) Field of Classification Search
CPC . G06F 2203/04103; G06F 2203/04104; G06F 2203/04105; G06F 2203/04106;
(Continued)

(56) References Cited

U.S. PATENT DOCUMENTS 4,263,593 A    4/1981    Dagostino et al.
4,805,198 A    2/1989    Stern et al.
(Continued)

FOREIGN PATENT DOCUMENTS

CN    103425810 A    12/2013
WO    2006063361 A2    6/2006

OTHER PUBLICATIONS

Schmitz et al. "On the Validity of Single-Ended Mixed-Mode S-Parameter Measurements for Differential Active Devices" Oct. 1, 2009, ieee p. 691-694. (Year: 2009).*
(Continued)

*Primary Examiner* — Binh C Tat
(74) *Attorney, Agent, or Firm* — Cantor Colburn LLP; Tihon Poltavets

(57) ABSTRACT

A method of forming a mixed mode response from a single ended mode input includes modeling a first voltage controlled current source based on relative values of a $v_{positive}$ input signal and a $v_{negative}$ input signal and modeling a second voltage controlled current source based on relative values of the $v_{positive}$ input signal and the $v_{negative}$ input signal. A method of forming a single ended mode response from a mixed mode input modeling a first voltage controlled current source based on relative values of a $v_{DIFFin}$ input signal and a $v_{COMMin}$ input signal and modeling a second voltage controlled current source based on relative values of the $v_{DIFFin}$ input signal and the $v_{COMMin}$ input signal, the second voltage controlled being connected to ground through a second terminating impedance that is equal to the reference impedance ($Z_0$).

3 Claims, 9 Drawing Sheets

(51) Int. Cl.
 *G06F 30/39* (2020.01)
 *G06F 30/394* (2020.01)
(58) Field of Classification Search
 CPC ............. G06F 3/03545; G06F 3/04146; G06F 3/04162; G06F 3/04166; G06F 3/041661; G06F 3/04182; G06F 3/04186; G06F 3/0441; G06F 3/0442; G06F 3/0445; G06F 3/0446; G06F 3/0447; G06F 3/0448; G06F 3/045; G06F 3/046; G06F 3/047; G06F 3/0436; G06F 30/30; G06F 30/367; G06F 30/39; G06F 30/394; G06F 1/22; G06F 1/3203; G06F 1/3215; G06F 1/3237; G06F 1/3259; G06F 1/3271; G06F 13/385; G06F 17/16; G06F 2213/3814; G06F 3/0231; G06F 3/03543; G06F 3/038; G06F 3/0383; H01L 41/042; H01L 25/16; H01L 25/18; H01S 3/06737; G02F 1/3534; G02F 1/0142; G02F 1/0353; G02F 7/00; G02F 1/0136; G02F 1/31; G02F 1/3546; G02F 1/3558; G02F 2203/50; G02F 2/004; G02F 1/35
 USPC .................................................. 716/100–109
 See application file for complete search history.

(56) References Cited

U.S. PATENT DOCUMENTS

| | | | |
|---|---|---|---|
| 6,285,197 | B2 | 9/2001 | Walker |
| 6,515,486 | B1 | 2/2003 | Nguyen |
| 6,937,971 | B1 | 8/2005 | Smith et al. |
| 7,010,768 | B2 | 3/2006 | Dahlen et al. |
| 7,412,005 | B2 | 8/2008 | Wang et al. |
| 8,327,204 | B2 | 12/2012 | Hafed et al. |
| 8,552,783 | B2 | 10/2013 | Rylov |
| 8,605,566 | B2 | 12/2013 | Schmukler et al. |
| 8,670,969 | B1 | 3/2014 | Kundert |
| 8,904,331 | B1 | 12/2014 | Fung |
| 9,712,315 | B1 | 7/2017 | Chen |
| 9,984,189 | B2 | 5/2018 | Chen |
| 2003/0013419 | A1 | 1/2003 | Razavi et al. |
| 2003/0017809 | A1 | 1/2003 | Garlepp et al. |
| 2004/0183716 | A1* | 9/2004 | Shono ............... G01S 7/034 342/82 |
| 2006/0050827 | A1 | 3/2006 | Saeki et al. |
| 2006/0068746 | A1* | 3/2006 | Feng ............... H04B 1/30 455/323 |
| 2008/0054966 | A1 | 3/2008 | Tamura |
| 2008/0068236 | A1 | 3/2008 | Sheba et al. |
| 2009/0258624 | A1* | 10/2009 | Gudem ............ H04B 1/109 455/234.1 |
| 2009/0319065 | A1 | 12/2009 | Risbo |
| 2011/0050359 | A1* | 3/2011 | Yahav ............... H03H 7/38 333/132 |
| 2012/0223732 | A1 | 9/2012 | Kobayashi |
| 2013/0243138 | A1 | 9/2013 | Jiang et al. |
| 2013/0301691 | A1 | 11/2013 | Wang et al. |
| 2014/0074446 | A1 | 3/2014 | Hollis |
| 2014/0107997 | A1 | 4/2014 | Li et al. |
| 2016/0049913 | A1 | 2/2016 | Jussila |
| 2017/0242946 | A1 | 8/2017 | Chen |
| 2017/0244504 | A1 | 8/2017 | Chen |
| 2018/0225401 | A1 | 8/2018 | Chen |

OTHER PUBLICATIONS

Schmitz et al. "On the Validity of Single-Ended Mixed-Mode S-Parameter Measurements for Differential Active Devices" Oct. 1, 2009, ieee p. 691-694. (Year: 2009) (Year: 2009).*
Peter J. Pupalaikis ("Validation Methods for S-Parameter Measurements Based Models of Differential Transmission Lines" 2008 pp. 1-23 (Year: 2008).*
Peter J. Pupalaikis ("Validation Methods for S-Parameter Measurements Based Models of Differential Transmission Lines" 2008 pp. 1-23) (Year: 2008). (Year: 2008).*
Bockelman et al. ("Combined Differential and Common-Mode Scattering Parameters: Theory and Simulation " Jul. 1995 pp. 1530-1539 (Year: 1995).*
IBM "List of IBM Patents or Patent Applications Treated as Related; (Appendix P)", Filed Apr. 6, 2018, 2 pages.
Agilent Technologies, "Characterizing Your PLL-based Designs to Manage System Jitter", Agilent Technologies, Mar. 2008, 18 pages.
Alpert, Andreas, "Jitter Measurements in Telecom Transmission Systems—Improving Accuracy and Repeatability", JDSU, 2014, 18 pages.
Baprawski, John, "Using AMI Retimer Models in ADS ChannelSim", Agilent Technologies, Jan. 23, 2012, 15 pages.
Bockelman et al., "Combined Differential and Common-Mode Scattering Parameters: Theory and Simulation", IEEE Transactions on Microwave Theory and Techniques, vol. 43, No. 7, Jul. 1995, pp. 1530-1539, 10 pages.
Chen, Zhaoqing "Linear Circuit Model Combination for Coupled Noise Simulation by Using Directional Junction", IEEE 14th Topical Meeting on Electrical Performance of Electronic Packaging, Oct. 2005, pp. 83-86, 4 pages.
Chen, Zhaoqing "Packaging System S-Parameter Model Decomposition and On-Demand Composition Using Directional Junctions for Signal Integrity Transient Simulation", 59th Electronic Components & Technology Conference, May-Jun. 2009, pp. 1964-1969, 6 pages.
Chen, Zhaoqing, "Decision Feedback Equalizer (DFE) Behavioral Macro Model for Packaging System Eye Diagram Transient Simulations", IBM, IEEE, 2011, 8 pages.
Chen, Zhaoqing, "Receiver Macro Modeling Including DC, Filter, and Preamplifier Nonlinear Properties for Packaging System Transient Simulations", IBM, IEEE, Electronic Components and Technology Conference, 2010, 8 pages.
Chong, et al IBIS AMI Modeling of Retimer and Performance Analysis of Retimer based Active Serial Links, Jan. 2014, Design Con. 47 pages.
Demir et al., "Behavioral Simulation Techniques for Phase/Delay-Locked Systems", IEEE 1994 Custom Integrated Circuits Conference, 1994, 4 pagse.
Hauenschild et al. "Influence of Transmission-Line Interconnections Between Gigabit-per-Second IC's on time Jitter and Instabilites" IEEE, Journal of Solid-State Circuits, vol. 25, No. 3 (1990) {retrieved on Apr. 20, 2018]. retrieved from <https://ieeexplore/ieee.org/document/102673>.
Haur et al.,"IBIS AMI Modeling of Retimer and Performance Analysis of Retimer based Active Serial Links" DesignCon, 2014, 22 pages.
Honeywell, "HXSD02 Slider: 1x/4x sRIO PHY and SERDES Quad Transceiver Radiation Hardened", www.honeywellmicroelectronics.com, 11 pages.
IDT,"PCI Express Reference Clock Requirements" Integrated Device Technology, An-843, Revision A May 12, 2014, 25 pages.
Katz et al., "Modeling Analog Repeaters in IBIS-AMI", SiSoft, Feb. 3, 2011, 12 pages.
Kim et al. "Analysis and Simulation of Jitter Sequences for Testing Serial Data Channels" IEEE Transactions on Industrial Informatics, vol. 4, No. 2 (2008) [retrieved on Apr. 20, 2018]. Retrieved from <https://ieeexplore.ieee.org/document/4526708>.
Li, et al.,"Transfer Functions for the Refence Clock Jitter In A Serial Link: Theory and Applications", ITC International Test Conference, IEEE, 2004, 10 pages.
National Instruments, "Understanding and Characterizing Timing Jitter", www.ni.com, Apr. 17, 2013, 19 pages.
Pupalaikis, Peter J. "Validation Methods for S-parameter Measurement Based Models of Differential Transmission Lines", LeCroy Corporation, 2008, 25 pages.
Quaries. "Spice3 Version 3C1 Users Guide" Memorandum No. UCB/ERL M89.46 (1989), pp. 1-20, 71-80 [retrieved on Apr. 24, 2018]. Retrieved from <https://www2/eecs.berkeley/edu/Pubs/TechRpts/1989/ERL-89-46.PDF>.

(56) References Cited

OTHER PUBLICATIONS

Rao et al., "Analysis of Jitter-Induced Voltage Noise in Clock Channels", IEEE Transactions on Electromagnetic Compatibility, vol. 57, No. 4, Aug. 2015 pp. 788-795, 8 pages.
Rao et al., "Frequency Domain Analysis of Jitter Amplification in Clock Channels", in Proc.,2012, EPEPS, pp. 51-54, 4 pages.
Rao et al., "Mechanism of Jitter Amplification in Clock Channels", Keysight Technologies, DesignCon 2014, 24 pages.
Shou et al., Design of COMOS Ternary Latches, Dec. 2006, IEEE, p. 2558-2594.
Silicon Labs," PCI Express 3.0 Jitter Requirements", AN562, rev. 1, Dec. 2010, 24 pages.
Texas Instruments, DS100DF410,"DS100DF410 Low Power 10GbE Quad Channel Refiner", SNLS399B, Jan. 2015, 57 pages.
Xia et al., "Timing Jitter Characterization for Mixed-Signal Production Test Using the Interpolation Algorithm", IEEE Transactions on Industrial Electronics, vol. 54, No. 2, Apr. 2007, pp. 1014-1023, 10 pagse.
Fitzpatrick, D. "Analog Design and Simulation using OrCAD Capture and PSpice" Elsevier, p. 138 [retrieved on Apr. 23, 2018]. Retrieved from STIC. (Year: 2012).
Yamaguchi et al. "Effects of Deterministic Jitter in a Cable on Jitter Tolerance Measurements" ITC International Test Conference, Paper 3.2 [retrieved on Aug. 12, 2019], Retrieved from <https://ieeexplore.ieee.org/stamp/stamp.jsp?amumber=1270825> (Year: 2003).

* cited by examiner

SINGLE-ENDED-MODE TO MIXED-MODE TRANSFORMER SPICE CIRCUIT MODEL FOR HIGH-SPEED SYSTEM SIGNAL INTEGRITY SIMULATIONS

DOMESTIC PRIORITY

This application is a divisional of U.S. patent application Ser. No. 15/047,002, filed Feb. 18, 2016, the disclosure of which is incorporated by reference herein in its entirety.

BACKGROUND

The present invention relates to electronic circuits, and more specifically, to systems and methods for designing and analyzing the transient response of an electronic circuit.

Advances in the field of computer and electronic system design continue to drive and facilitate greater processing efficiencies. Through modeling and other analysis, electronic files containing designs for electronic circuits and computer systems are optimized for use as templates for hardware manufacturing and networking.

A typical computer/circuit design file includes text that accounts for numerous electronic hardware components. For example, a file containing a design commonly includes programmatic objects and identifiers descriptive of busses, microchips, expansion cards and other system hardware. A bus generally enables selective communication between a computer processor unit (CPU) and one or more components, such as those mounted on an expansion card. A typical bus, such as a Peripheral Component Interconnect or Industry Standard Architecture bus, may additionally couple to a main system circuit board. Expansion cards are typically thin, rectangular printed circuit boards that have connector pins along one edge that couple to corresponding sockets of the bus. Programmatic objects describing such components within the design file may include delay, routing, voltage, resistance, symbol and/or other parameter data.

In operation, actual components of a circuit cooperate to process electronic signals according to system requirements. More particularly, the components interconnect to generate and communicate electronic signals. Different combinations and configurations of components affect system performance. For example, component layout can impact system timing. System timing regards the arrival of a signal at a given component within a predetermined window of time. Each component visited along the path of a signal introduces varying delay that affects the time required for the signal to reach a destination component. Thus, successful timing requires coordination with other signals and signal paths to ensure coordinated system processing. Failure to achieve desired timing can result in processing delays, error and failure. For instance, a system function that conjunctively processes multiple signals cannot complete its processing until the last of the signals arrives. Thus, the function can be unduly delayed or altogether frustrated should an unacceptable amount of time lapse while waiting for the last of the signals to arrive. For example, delays may cause race conditions, where a process may shutdown altogether in response to a late signal.

Another performance factor affected by system design is noise. Noise is characterized as static or interference introduced as the signal travels through system components and connections. As such, the electrical characteristics of the signal change as it propagates through a system. For instance, square wave characteristics of an input signal may become less distinct due to loss dispersion encountered in a system. While some tolerance of noise is typically built into a system design specification, unacceptable noise levels can severely impact signal clarity and system performance. For example, data may become corrupted, e.g., a binary "1" may register as a "0."

Production of a hardware system represents a substantial investment of material, manpower and other economic resources. Consequently, it is advantageous to verify design integrity prior to committing it to hardware. More particularly, it is desirable to predict or otherwise analyze performance characteristics of a design prior to implementation. To this end, simulation programs, or engines, have been developed to model performance of the programmatic objects of a design. Such modeling practices help to assure conformity with system needs.

SUMMARY

According to an embodiment a method of forming a mixed mode response from a single ended mode input is disclosed. The method includes: receiving at a single ended mode converter a $v_{positive}$ input signal and a $v_{negative}$ input signal, the signals being received on input that is connected to ground though a reference impedance ($Z_0$); modeling a first voltage controlled current source based on relative values of the $v_{positive}$ input signal and a $v_{negative}$ input signal, the first voltage controlled being connected to ground through a first terminating impedance that is a first multiple of the reference impedance ($Z_0$); and modeling a second voltage controlled current source based on relative values of the $v_{positive}$ input signal and the $v_{negative}$ input signal, the second voltage controlled being connected to ground through a second terminating impedance that is a second multiple of the reference impedance ($Z_0$). The method also includes: forming a $v_{DIFFout}$ voltage equal to the current produced by the first voltage controlled current source multiplied by the first terminating impedance; and forming a $v_{COMMout}$ voltage equal to the current produced by the second voltage controlled current source multiplied by the second terminating impedance.

Also disclosed is a method of forming a single ended mode response from a mixed mode input. The method includes: receiving at a mixed mode converter a $V_{DIFFin}$ input signal on a first input connected to ground though a first impedance that is a first multiple of a reference impedance ($Z_0$); receiving at a mixed mode converter a $V_{DIFFin}$ input signal, on a second input connected to ground though a second impedance that is a second multiple of the reference impedance ($Z_0$); modeling a first voltage controlled current source based on relative values of the $V_{DIFFin}$ input signal and the $v_{COMMin}$ input signal, the first voltage controlled being connected to ground through a first terminating impedance that is equal to the reference impedance ($Z_0$); and modeling a second voltage controlled current source based on relative values of the $V_{DIFFin}$ input signal and the $v_{COMMin}$ input signal, the second voltage controlled being connected to ground through a second terminating impedance that is equal to the reference impedance ($Z_0$). The method also includes forming a $v_{pout}$ voltage equal to the current produced by the first voltage controlled current source multiplied by the first terminating impedance; and forming a $v_{nout}$ voltage equal to the current produced by the second voltage controlled current source multiplied by the second terminating impedance.

Also disclosed is a method of providing a bidirectional single mode/mixed mode converter. The method includes providing a single-ended mode to mixed mode (SE/MM)

converter having first and second inputs; providing a mixed mode to single-ended mode (MM/SE) converter having third and fourth inputs; and coupling a different one of a plurality of 2 to 1 directional converters to each of the first, second, third and fourth inputs.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
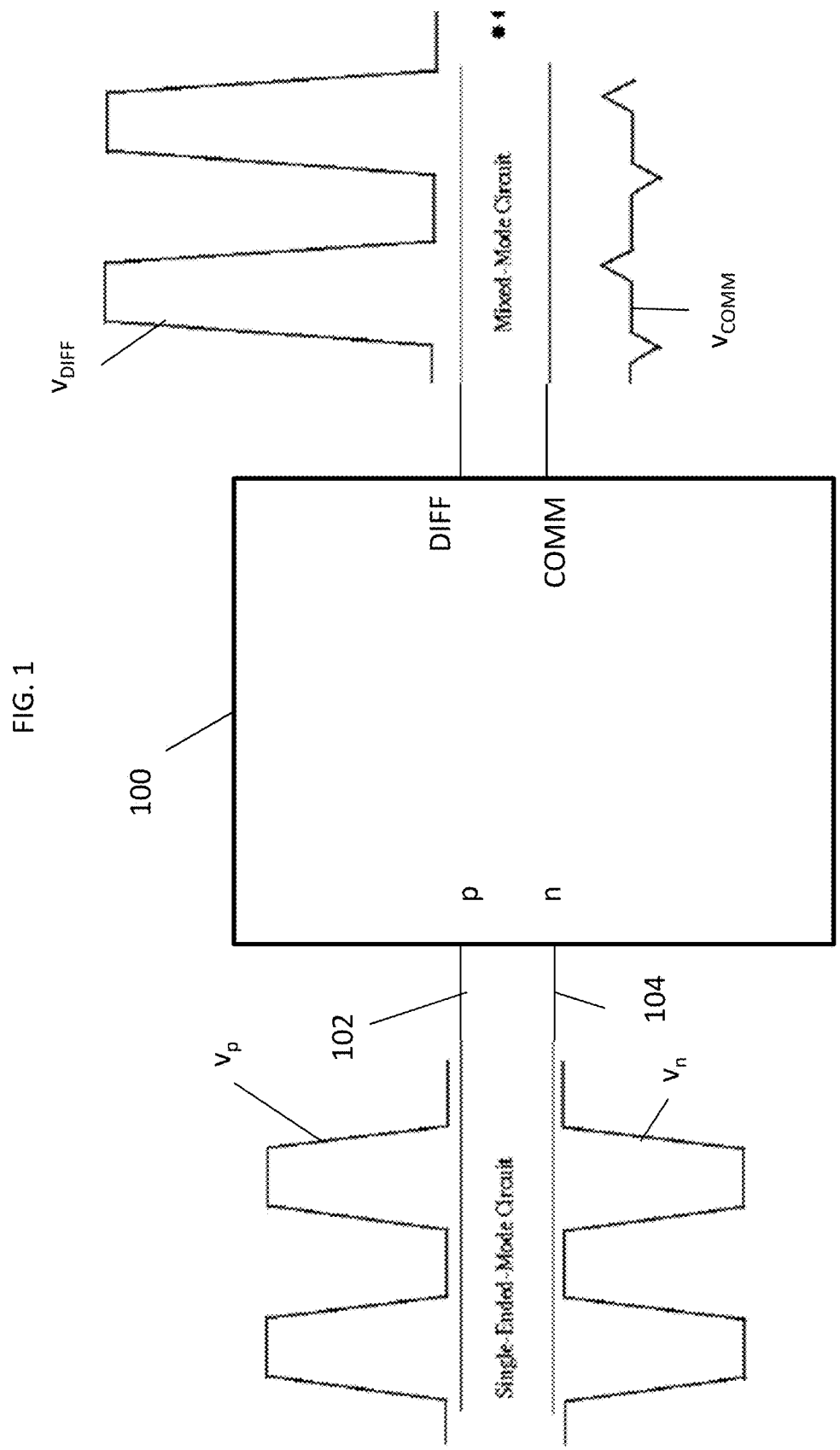
FIG. 1 is a block diagram illustrating one embodiment of a single ended (SE) mode to mixed-mode (MM) transformer.

FIG. 1 shows an example of a single ended (SE) mode to mixed-mode (MM) transformer 100 according to one embodiment. In short, the transformer converts two single-ended mode voltages of a differential pair into representation of these two voltages as a differential mode voltage $v_{DIFF}$ and a common mode voltage $v_{COMM}$. The transformer is bi-directional. It also converts two mixed-mode voltages into two single-ended-mode voltages.

In practice, differential signaling nets (e.g., paths) are widely used in the high-speed packaging systems such as in the PCIe bus because of smaller return path loop, therefore smaller crosstalk and EMI to/from other nets than the single-ended signaling net. In differential signaling, and as shown in FIG. 1, a signal is transmitted by a wire pair consisting of a positive signal wire 102 and negative signal wire 104.

In a simulation, the deferential signal along the net transmission path can be described by two node voltages of a note pair, vp at the positive node, Node p, and vn at the negative node, Node n, where vp and vn are regularly defined node voltages, or single-ended mode voltages, at corresponding physical locations in the hardware. In some applications, so called mixed mode voltages, namely the differential mode voltage $v_{DIFF}$ and the common mode voltage $v_{COMM}$ are introduced. Such signals may be useful in evaluating the performance of the packaging system using differential signaling, for example.

In FIG. 1, if positive signal $v_p$ is received at node p and the negative signal $v_n$ is received at node n. The mixed-mode signals $v_{DIFF}$ and $v_{COMM}$ are output from the transformer at nodes DIFF and COMM, respectively. It shall be understood that a physical location in a circuit may not actually exist where the signals $v_{DIFF}$ and $v_{COMM}$ exist. Thus, it may be difficult or impossible using presently known modeling techniques to have such signals available in a behavioral simulation.

The value $v_{DIFF}$ and $v_{COMM}$ may, respectively, be defined such that the differential mode ($v_{DIFF}$) is a pure difference in voltages at nodes p and n while the common mode ($v_{COMM}$) is the average of the voltages presented at nodes p and n as shown equations 1 and 2 below:

$$v_{DIFF} = v_p - v_n \qquad (1); \text{ and}$$

$$v_{COMM} = (v_p + v_n)/2 \qquad (2).$$

It shall be understood, that the transformer shown in FIG. 1 may also be able to convert from a mixed mode signal according to equations 3 and 4 below:

$$v_p = (2v_{COMM} + v_{DIFF})/2 \qquad (3); \text{ and}$$

$$v_n = (2v_{COMM} - v_{DIFF})/2 \qquad (4).$$

As such, the transformer may be referred to herein as an SE mode/MM transformer with understanding that the conversion can be made in both directions (e.g, from SE to MM and from MM to SE). According, it shall be understood that multiple instances of the transformer may be used in cases where the conversions from actual voltages (e.g., $v_p$ and $v_n$) to mixed mode voltages are made, the mixed mode voltages are used to perform a function, and the output is converted back to a differential voltage signal.

Figure 2:
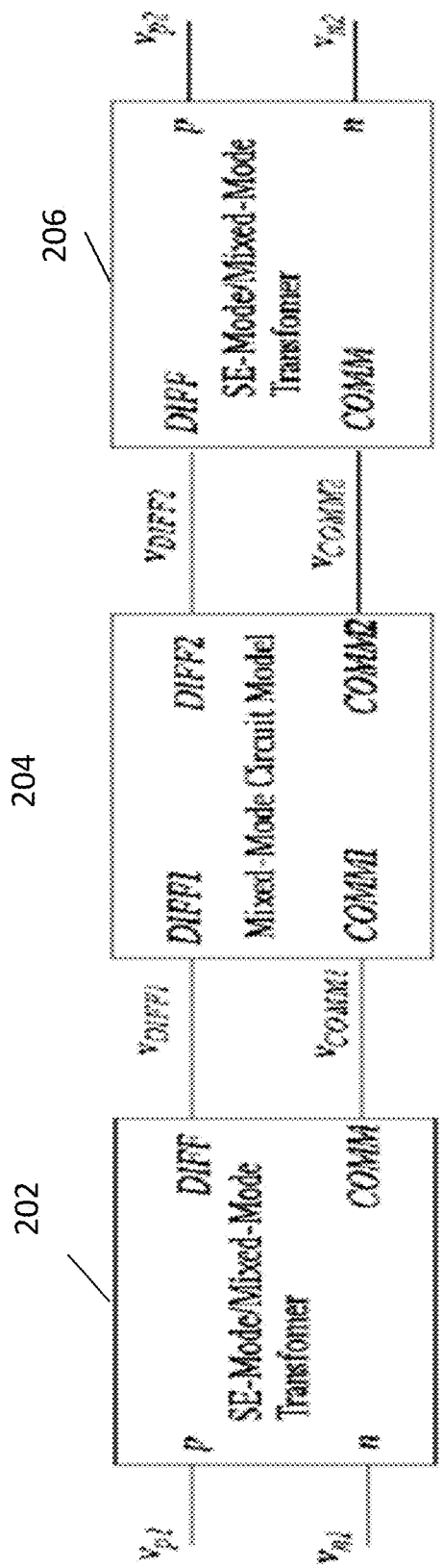
FIG. 2 is block diagram of two single ended (SE) mode to mixed-mode (MM) transformers coupled to a mixed mode circuit model.

As shown in FIG. 2, a first transformer 202 may extract $v_{COMM}$ and $v_{DIFF}$ from differential voltage pair $v_{p1}$–$n_{p1}$ and provide $v_{COMM1}$ and $v_{DIFF1}$ to a circuit model 204 that calls for such inputs and then a second transformer 204 converts the outputs of the models $v_{COMM2}/v_{DIFF2}$ back to single-ended-mode voltage pair $v_{p2}$–$n_{p2}$.

Figure 3:
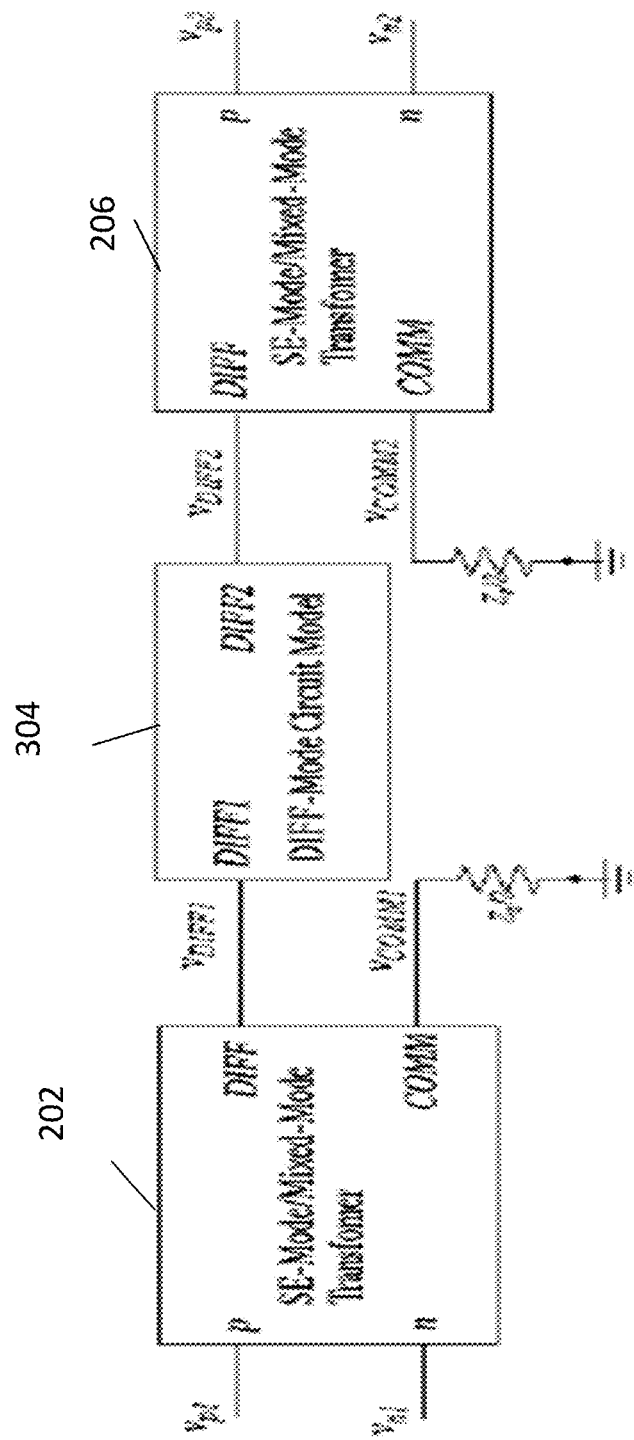
FIG. 3 is block diagram of two single ended (SE) mode to mixed-mode (MM) transformers coupled to a DIFF mode circuit model.

In addition, and as generally shown in FIG. 3, in some instances, a model 304 that only considers $v_{DIFF}$ may exist. An example of such a case is a jitter transfer model that receives $v_{DIFF1}$ and ignores $v_{COMM1}$.

The particular model of the SE/MM mode transformer 100 may be implemented in a behavioral circuit modeling program. SPICE (Simulation Program with Integrated Circuit Emphasis), HSPICE, or POWERSPICE circuit models are examples of such programs.

Figure 4:
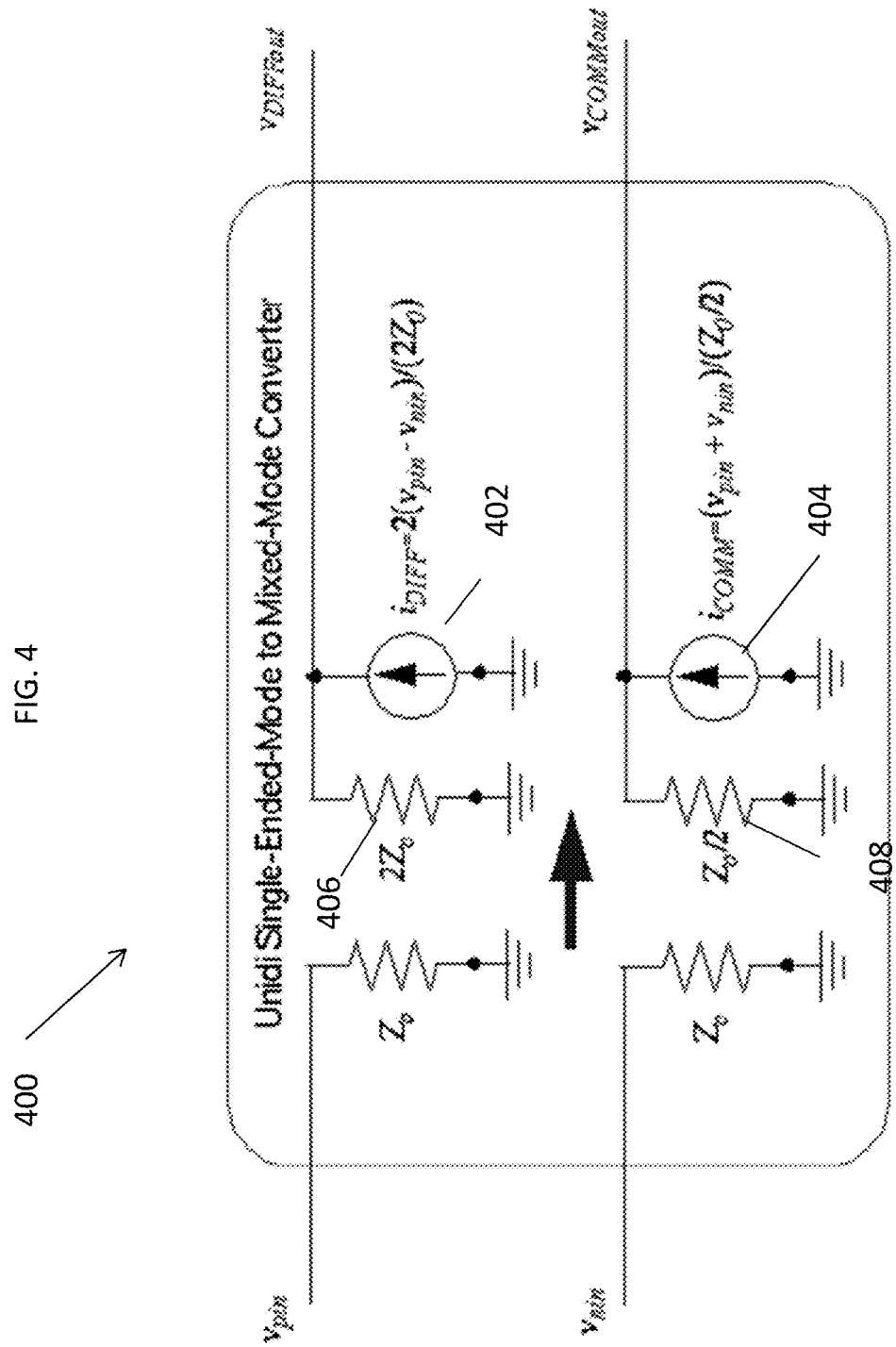
FIG. 4 is a representation of a model used in a unidirectional single-ended (SE) mode to mixed mode (MM) conversion.

FIG. 4 shows an example of an SE to ME model 400 that may be used to partially convert from an SE to MM. Model 400 is a portion of transformer 100 described generally above. It shall be understood that this model is for a perfect matching so it does not exactly follow equations 1 and 2 above in the case of mismatching terminations at VDIFFout and vCOMMout side (consideration of FIGs. x-y will lead to such convergence as further described below).

The converter includes two inputs $v_{pin}$ and $v_{nin}$. The values across these terminations are used to define current sources for both producing the outputs. In particular, the voltages $v_{pin}$ and $v_{nin}$ are used to define first and second voltage controlled current sources 402, 404. The current produced by the first voltage controlled current source 402 is denoted as $i_{DIFF}$ and is connected to ground through a difference impedance 406 with impedance $2Z_0$. In one embodiment, $i_{DIFF}$ is:

$$i_{DIFF} = 2(v_p - v_n)/2Z_0.$$

Thus, the "DIFF" output of the model 400 ($v_{DIFFout}$) is equal to:

$$v_{DIFFout}=2(v_p-v_n).$$

Similarly, current produced by the second voltage controlled current source 404 is denoted as $i_{COMM}$ and is connected to ground through a comm impedance 408 with impedance $Z_0/2$. In one embodiment, $i_{COMM}$ is:

$$i_{COMM}=(v_p+v_n)/Z_0/2).$$

Thus, the "COMM" output of the model 400 ($v_{COMMout}$) is equal to:

$$v_{COMMout}=(v_p-v_n).$$

Figure 5:
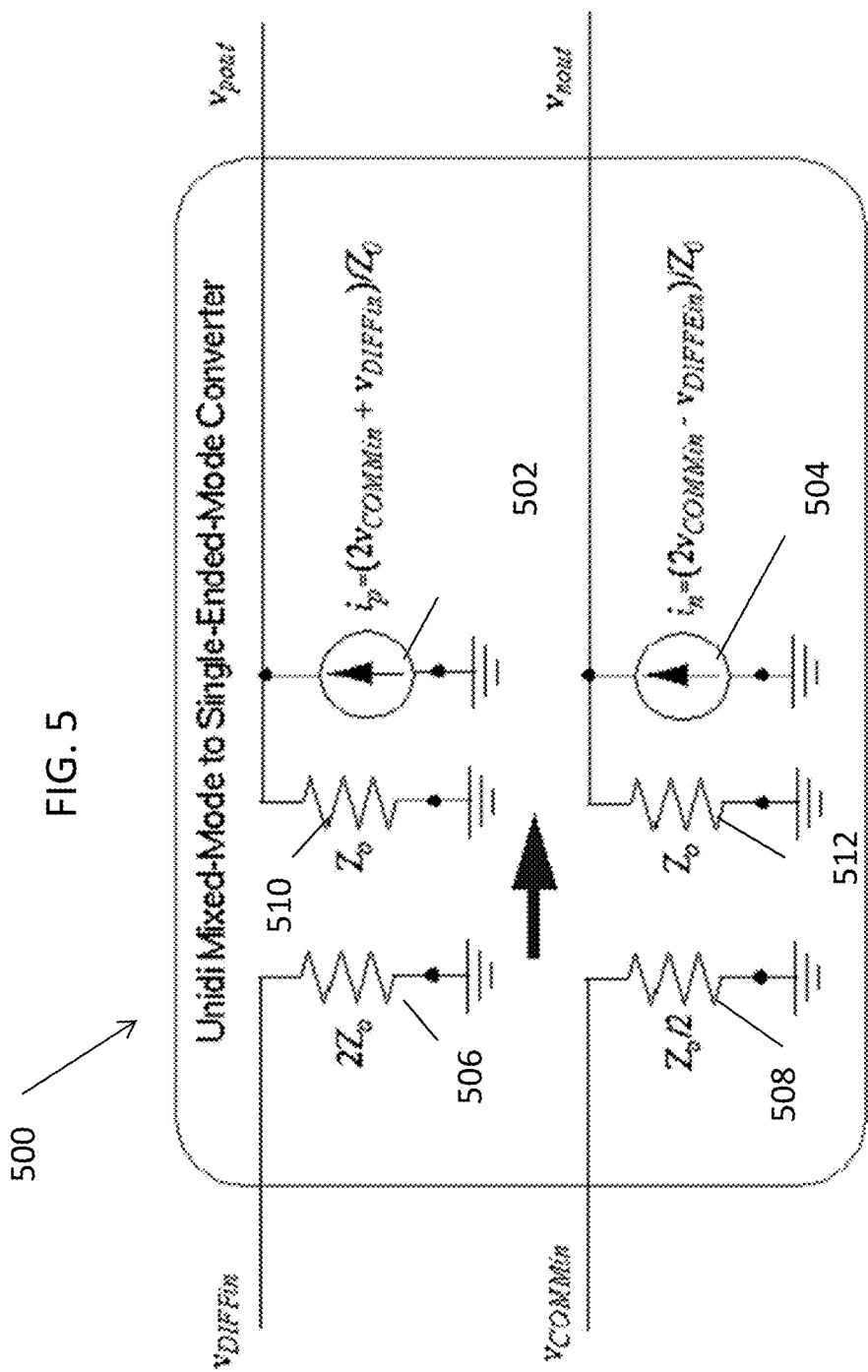
FIG. 5 is a representation of model used in a unidirectional MM to SE mode conversion.

For conversions in the other direction, (e.g, from MM to SE) an MM to SE module 500 is provided and of which an example is shown in FIG. 5. Model 500 is a portion of transformer 100 described generally above. It shall be understood that this model is for a perfect matching so it does not exactly follow equations 3 and 4 above in the case of mismatching terminations at $v_{pout}$ and $v_{nout}$.

The converter includes two inputs $v_{DIFFin}$ and $v_{COMMin}$. Both are separately terminated through respective input impedances 506, 508. The values of these is the same as the values of the impedances used to produce $v_{DIFF}$ and $v_{COMM}$ described above, namely, $2Z_0$ and $Z_0/2$. The voltages across these terminations are used to define current sources for both producing the outputs. In particular, the voltages defines current produced by first and second voltage controlled current sources 502, 504. The current produced by the first voltage controlled current source 502 is denoted as $i_{pout}$ and is connected to ground through a positive leg impedance 510 with impedance $Z_0$. In one embodiment, $i_p$ is:

$$i_p=(2v_{COMMin}+v_{DIFFin})/Z_0.$$

Thus, the "p" or positive leg output of the model 500 ($v_{pout}$) is equal to:

$$v_{pout}=(2v_{COMMin}+v_{DIFFin}).$$

Similarly, current produced by the second voltage controlled current source 504 is denoted as $i_n$ and is connected to ground through a negative leg impedance 512 with impedance $Z_0$. In one embodiment, $i_n$ is:

$$i_n=(2v_{COMMin}-v_{nDIFFin})/Z_0.$$

Thus, the "n" or negative output of the model 500 ($v_{nout}$) is equal to:

$$v_{nout}=(2v_{COMMin}-v_{DIFFin}).$$

As discussed generally above, each of the models 400 and 500 is unidirectional and are applicable for perfectly matched circuits. To allow for bi-directional conversion, both models 400 and 500 are combined and matching circuits are provided between the outputs thereof such that equations 1-4 above are generally met.

Figure 6:
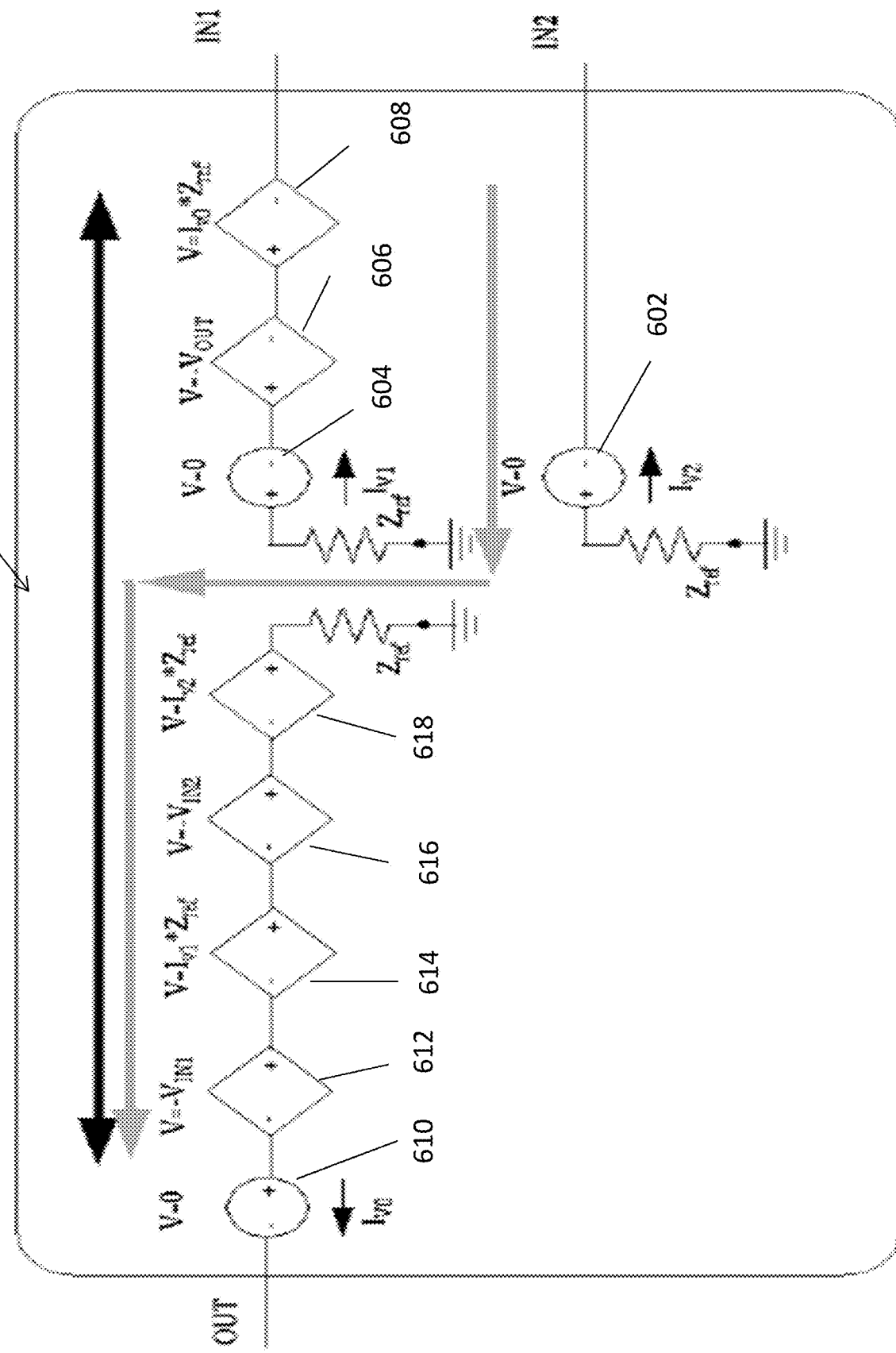
FIG. 6 is an example of a two to 1 (2 to 1) converter utilized by the transformer disclosed herein.

The matching circuit 600 is shown in FIG. 6. The matching circuit 600, when several are used, may allow for the models 400/500 to be coupled to an unmatched circuit and allow for the combination (e.g., transformer 100) to operate in two directions. As these models have two "input" terminals and one "output" terminal, they may be referred to as 2 to 1 directional junctions. It shall be understood that an input can output a signal in certain instances and vice versa.

Figure 7:
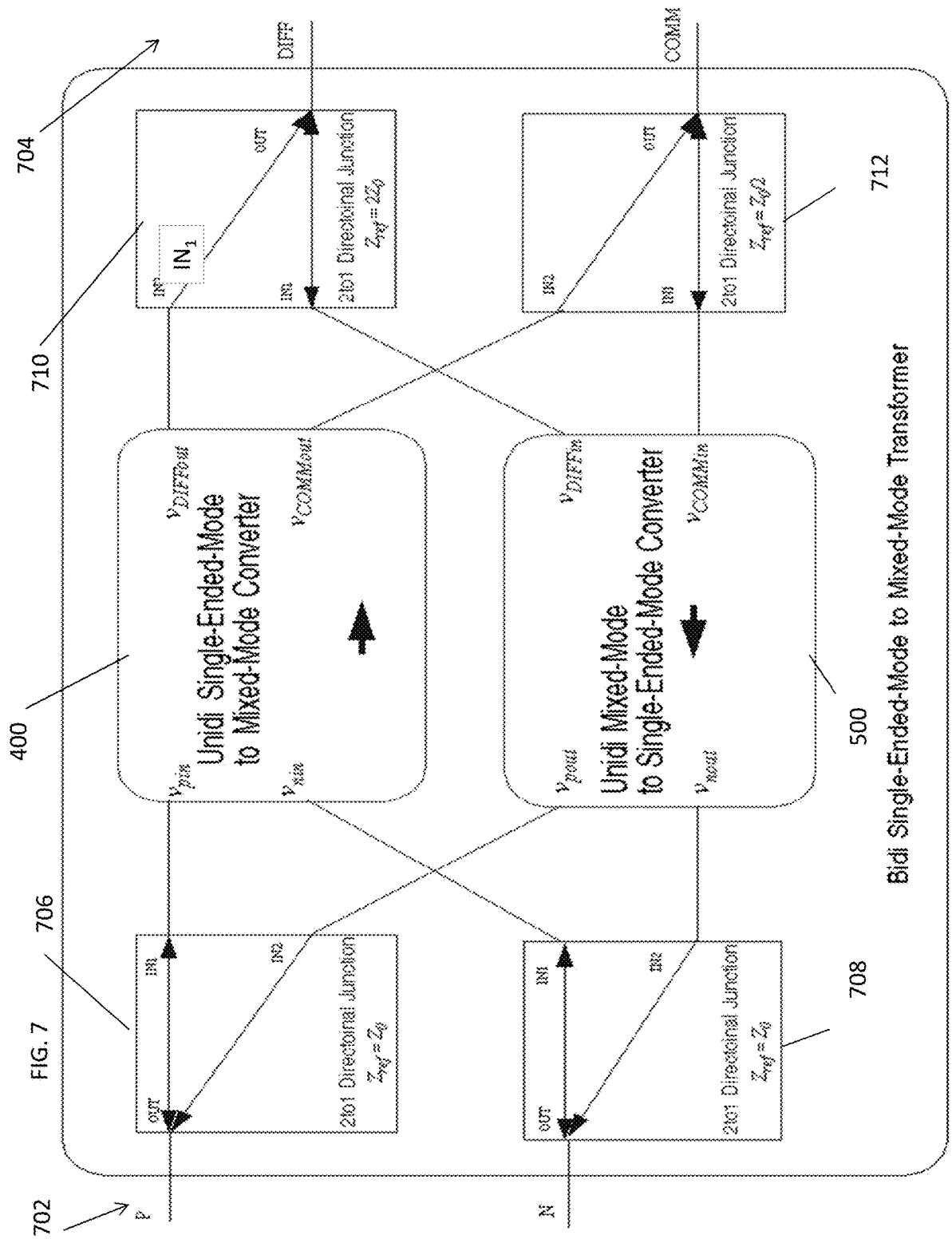
FIG. 7 is block diagram of a bi-directional transformed according to one embodiment.

Before explaining the circuit of FIG. 6 a completed is instructive and is shown in FIG. 7 with reference still being made to FIG. 6. In general, the circuit 700 may be thought of as the SE/MM transformer of FIG. 1. On the single ended (p,n) side 702 the circuit 700 receives or outputs P and N signals that represent a differential signal with P being the positive signal and N being the negative signal at ports P and N respectively. On the mixed mode (DIFF, COMM) side 704 the circuit 700 receives or outputs a DIFF and a COMM signal at ports DIFF and COMM, respectively. In operation, P and N signals received at ports P and N will be converted to DIFF and COMM signals at ports DIFF and COMM respectively. The conversion follows equations 1 and 2 above.

In that regard, the signals pass from left to right. The signal at port P passes to the SE to MM model 400 through a first 2 to 1 converter 706. The signal enters the 2 to 1 converter 706 a port OUT and leaves the first converter 706 via the $IN_1$ port. The signal at port N passes to the SE to MM model 400 through a second 2 to 1 converter 706. The signal enters the 2 to 1 converter 706 a port OUT and leaves the second converter 708 via the $IN_1$ port. The signal leaving the first converter 706 is provided as input $v_{pn}$ to circuit 400 and the signal leaving the second converter 708 is provided an input $v_{nin}$ to circuit 400. As will be understood, circuit 400 converts these inputs into $v_{DIFFout}$ and $v_{COMMout}$ as described above. These values are then respectively provided to third and fourth converters 710, 712, where $V_{DIFFout}$ is converted to DIFF and provided at the DIFF port and $v_{COMMout}$ is converted to COMM at the COMM port. In more detail, $v_{DIFFout}$ is provided to the $IN_1$ port of the third converter 710 and $v_{COMMout}$ is provided to the $IN_1$ port of the fourth converter. For the first converter 706 and the second converter 708 $Z_{ref}$ is equal to $Z_o$. In third converter 710 $Z_{ref}$ is equal to $2Z_o$ and in the fourth converter 712 $Z_{ref}$ is equal to $Z_o/2$.

In operation, a DIFF and COMM signals received at ports DIFF and COMM will be converted to differential signals and output at ports P and N respectively. The conversion follows equations 3 and 4 above.

In that regard, the signals pass from right to left. The signal at port DIFF passes to the MM to SE model 500 through the third 2 to 1 converter 710. The signal enters the 2 to 1 converter 710 a port OUT and leaves the third converter 710 via the $IN_1$ port. The signal at port COMM passes to the MM to SE model 400 through fourth 2 to 1 converter 712. The signal enters the 2 to 1 converter 712 a port OUT and leaves the fourth converter 708 via the $IN_1$ port. The signal leaving the third converter 710 is provided as input $v_{DIFF}$ to circuit 400 and the signal leaving the fourth converter 712 is provided an input $v_{COMMin}$ to circuit 500. As will be understood, circuit 500 converts these inputs into $v_{pout}$ and $vn_{COMMout}$ as described above. These values are then respectively provided to the first and second 706, 708, where $v_{pout}$ is converted to P and provided at the P port and $v_{COMMout}$ is converted to COMM at the COMM port. In more detail, $v_{pout}$ is provided to the $IN_2$ port of the first converter 710 and $v_{nout}$ is provided to the $IN_2$ port of the second converter 708.

The 2 to 1 converter 600 (or simply "converter") of FIG. 6 includes, for each port IN1, IN2 and OUT, a termination to ground through a reference impedance $Z_{ref}$. The value of $Z_{ref}$ may be varied depending on how the converter is being utilized as explained above. The IN2 port includes a voltage source 602 that is set to V=0. Source 602 providing $I_{v2}$ which act like a current probe in the circuit simulator.

Port IN 1 is also terminated though reference impedance $Z_{ref}$ and includes a voltage source 604 also set to V=0 that operates the same as source 602. In addition, the termination includes two voltage controlled voltage sources 606, 608 that respectively produce voltage of $-V_{out}$ (the voltage a port OUT) and $I_oZ_{ref}$ where $I_0$ is the current leaving port OUT.

Similarly, port OUT is terminated through reference impedance $Z_{ref}$ and includes a voltage source 610 also set to V=0. The terminal also includes four voltage controlled voltage sources 612 (V=$-V_{IN1}$), 614 (V=$-I_{v1}Z_{ref}$), 616 (V=$-V_{in2}$) and 618 (V=$I_{v2}Z_{ref}$). It shall be understood that depending on the direction signal flow, some of the sources may have no impact on the output signal. For instance, in the case where no signal is received at the $IN_1$ port, block 610 will not contribute to the voltage provided at OUT. The same is true of block 612.

Figure 8:
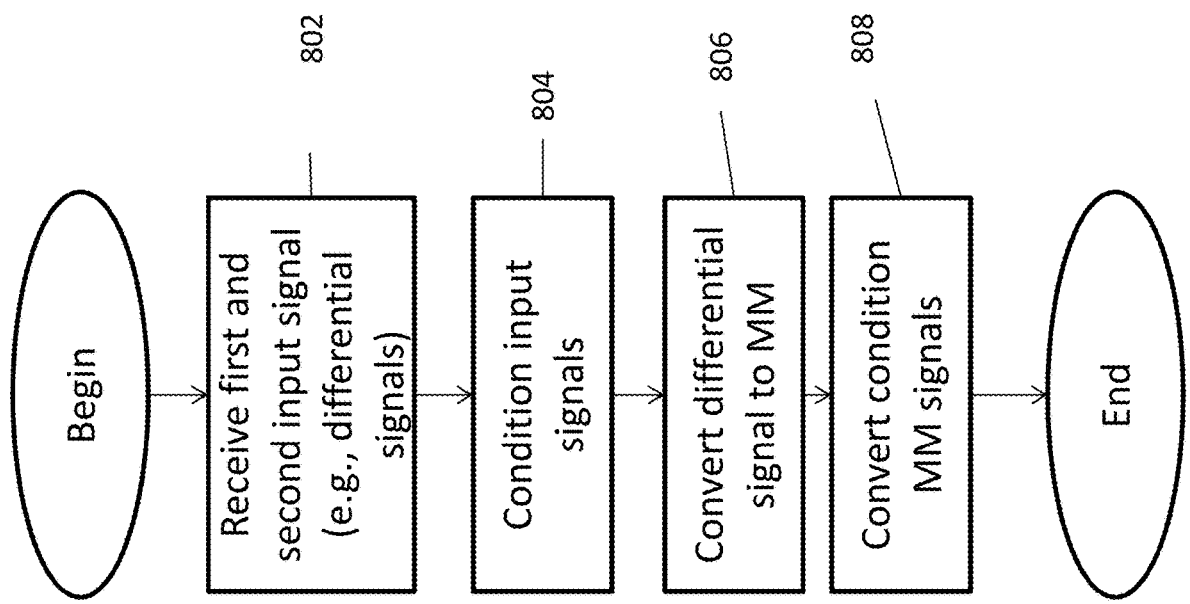
FIG. 8 is flow chart of a method of converting from a MM signal to an SE mode signal.

FIG. 8 shows a method according to one embodiment and is provided to show particular functions of the bi-directional transformer model disclosed herein. At block 802 a differential signal (p,n) are received at P and N ports of an SM/MM transformer. The transformed may as described above or may be modified slightly depending on the context. The block the 804 the signals are may optionally be conditioned in first and second converters that may be formed such as converter 600 and arranged like converters 706 and 708 in FIG. 7. Regardless, the signal then undergoes a conversion at block 806 from a differential signal to a mixed mode signal in a single to mixed mode converter. This converter may be modelled as including an input that receives input signals $v_{pin}$ and $v_{nin}$. These two signals are used to create signals $v_{DIFFout}$ and $v_{COMMout}$. The creation of these signal may take place in a model and that model may take the form of circuit 400 described above. At block 808, $v_{DIFFout}$ and $v_{COMMout}$ are optionally provided to third and fourth converters, respectively. Again, the converters may take the form of circuit 600 described above.

Figure 9:
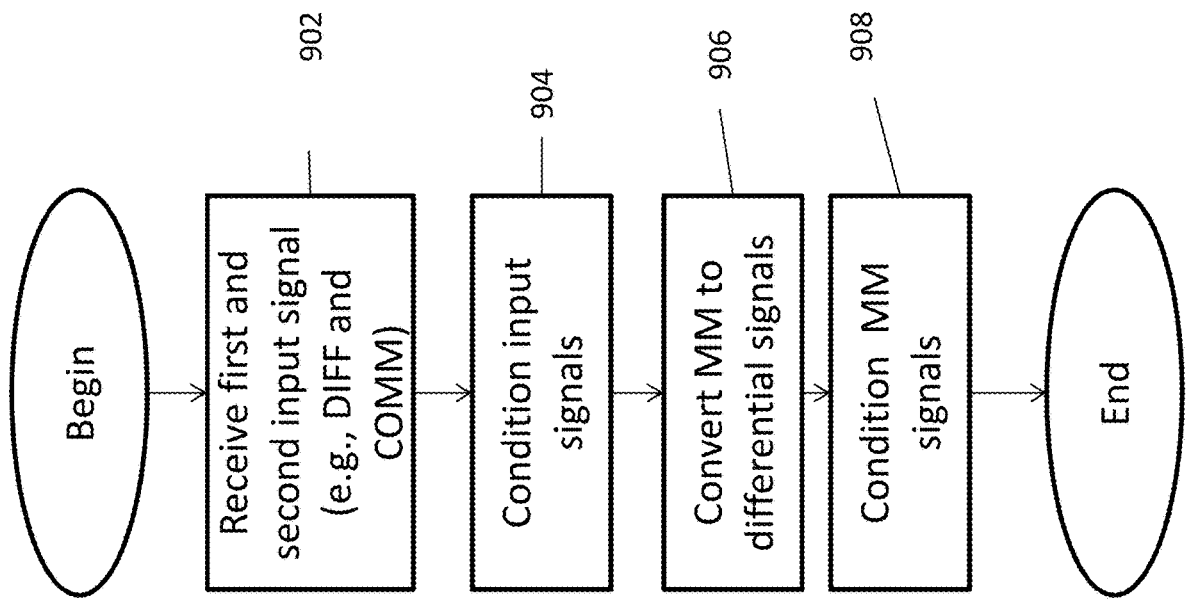
FIG. 9 is flow chart of a method of converting from a SE mode signal to an ME signal.

FIG. 9 shows a method according to another embodiment. At block 902 an MM (DIFF, COMM) signals (p,n) are received at DIFF and COMM ports of an SM/MM transformer. The transformed may as described above or may be modified slightly depending on the context. The block the 904 the signals may optionally be conditioned in third and fourth converters that may be formed such as converter 600 and arranged like converters 710 and 712 in FIG. 7. Regardless, the signal then undergoes a conversion at block 806 from a mixed mode signal to a single-ended mode signal. This converter may be modelled as including an input that receives input signals $V_{DIFFin}$ and $v_{DIFFin}$. These two signals are used to create signals $v_{pout}$ and $v_{nout}$. The creation of these signal may take place in a model and that model may take the form of circuit 400 described above. At block 808, $v_{pout}$ and $v_{pout}$ are optionally provided to first and converters, respectively. Again, the converters may take the form of circuit 600 described above.

The above description has included information related to how simulation models may be used. It shall be understood that the models may be used in the process of circuit design. That design may include forming an initial circuit design and then testing that design. The testing may including utilizing any of the circuits or circuit models disclosed herein. The results of the test may then be analyzed, either manually or automatically or by combination of both, to determine if the circuit "passed." This may include considering whether certain tolerances were exceeded. This may be done by, for example, comparing a threshold value to one or more of the outputs. For example, if certain timing requirements are not met or the circuit is too susceptible to cross-talk or jitter may determine if the circuit passed. In the event that the circuit does not pass, one or more of the circuit parameters may be changed and, in what turn out to be a repetitive cycle, the circuit is again tested. This may allow for circuit problems to be discovered and corrected before fabrication. Thus, in one embodiment, a method of forming a circuit is disclosed that includes forming and testing a first circuit model, changing the first circuit model to a second circuit model, optionally testing the second circuit model and providing the second circuit model to a production system or operation to create a physical circuit from some or all of the second circuit model.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

It should be noted that the flowchart and block diagrams in the figures illustrate the architecture, functionality, and operation of possible implementations of systems, apparatuses, methods and computer program products according to various embodiments of the invention. In this regard, each block in the flowchart or block diagrams may represent a module, segment, or portion of code, which comprises at least one executable instruction for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a wave-guide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

This disclosure has been presented for purposes of illustration and description but is not intended to be exhaustive or limiting. Many modifications and variations will be apparent to those of ordinary skill in the art. The embodiments were chosen and described in order to explain principles and practical application, and to enable others of ordinary skill in the art to understand the disclosure.

Although illustrative embodiments of the invention have been described herein with reference to the accompanying drawings, it is to be understood that the embodiments of the invention are not limited to those precise embodiments, and that various other changes and modifications may be affected therein by one skilled in the art without departing from the scope or spirit of the disclosure.

What is claimed is:

1. A method of forming a bidirectional single mode/mixed mode converter, the method comprising:
   providing a model of a single-ended mode to mixed mode (SE/MM) converter having first and second inputs and that converts a signal mode signal to a mixed mode signal;
   providing a model of a mixed mode to single-ended mode (MM/SE) converter having third and fourth inputs and that converts a mixed mode signal to a single mode signal; and
   coupling in a computer simulation a different one of four 2 to 1 directional converters to each of the first, second, third and fourth inputs;
   forming a physical circuit in the production of a hardware device based on the simulation wherein at least one of the plurality of 2 to 1 directional converters includes:
   a probe voltage source coupled to ground; and
   a voltage controlled voltage source that provides an output voltage based on a signal from the SE/MM converter;

wherein at least one of the plurality of 2 to 1 directional converters includes:

another probe voltage source coupled to ground; and a voltage controlled voltage source that provides an output voltage based on a signal from the MM/SE converter.

2. The method of claim 1, wherein the first and second inputs are connected, respectively, to a positive and a negative signal of a differential pair.

3. The method of claim 1, wherein the third and fourth inputs are connected, respectively, to a difference signal Vdiff and a common signal Vcomm that is an average of two values.

* * * * *